(12) United States Patent
Anjomshoa et al.

(10) Patent No.: US 9,606,964 B1
(45) Date of Patent: Mar. 28, 2017

(54) VISUAL MODELLER FOR MATHEMATICAL OPTIMIZATION

(71) Applicant: INTERNATIONAL BUSINESS MACHINES CORPORATION, Armonk, NY (US)

(72) Inventors: Hamideh Anjomshoa, Victoria (AU); Olivia J. Smith, Parkville (AU)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/983,628

(22) Filed: Dec. 30, 2015

(51) Int. Cl.
*G06F 17/10* (2006.01)
*G06F 17/11* (2006.01)
*G06F 17/50* (2006.01)
*G06F 9/44* (2006.01)

(52) U.S. Cl.
CPC .......... *G06F 17/11* (2013.01); *G06F 17/5009* (2013.01); *G06F 8/34* (2013.01)

(58) Field of Classification Search
CPC ........................................................ G06F 8/34
USPC ............................................................. 703/2
See application file for complete search history.

(56) References Cited

U.S. PATENT DOCUMENTS

| 5,784,596 | A | 7/1998 | Melamed et al. |
| 7,451,403 | B1 | 11/2008 | Srinivasan et al. |
| 2008/0005155 | A1 | 1/2008 | Soma et al. |
| 2009/0322739 | A1 | 12/2009 | Rubin et al. |
| 2013/0085962 | A1 | 4/2013 | Duncanson et al. |

OTHER PUBLICATIONS

Fenelon: What's new in CPLEX Optimization Studio 12.6.1? IBM Product Brochure; 28 pp; Nov. 5, 2014.*
ILOG: Wikipedia, the free encyclopedia; Jul. 2014; 5 pp.*
Mandl: IBM ILOG Visualization; IBM product brochure; 2010; 33 pp.*

(Continued)

*Primary Examiner* — Hugh Jones
(74) *Attorney, Agent, or Firm* — Cantor Colburn LLP; Louis Percello

(57) ABSTRACT

Embodiments include methods, and computer program products of a visual modeler of mathematical optimization. Aspects include: analyzing requirements of a visual model of mathematical optimization, designing the visual model of mathematical optimization in graphical form using a visual interface, visualizing the visual model of mathematical optimization model, generating computer code for the solution of the optimization model, and providing output of the visual model of the mathematical optimization from the relevant solver. Designing may include: collecting required data in graphical form using the visual interface and from databases connected to the visual interface, designing objects manually using simple mathematical notation by an expert user, using descriptions in words for later implementation by an inexperienced user, and selecting from a list of standard object types. The providing may include providing output computer code in a predetermined language to one or more computers, and link visual model of mathematical optimization directly to one or more solvers to generate results of visual model of mathematical optimization.

17 Claims, 5 Drawing Sheets

(56) References Cited

OTHER PUBLICATIONS

IBM ILOG CPLEX V12.1 Users Manual for CPLEX; IBM product user guide; 2009; 952 pp.*
Varro; "Automated formal verification of visual modeling languages by model checking"; Software and Systems Modeling 3.2 (2004): 85-113.
Zhao et al; "A modified particle swarm optimization via particle visual modeling analysis"; Computers & Mathematics with Applications 57.11 (2009): 2022-2029.
Draman et al., "A clone-based graphical modeler and mathematical model generator for optimal production planning in process industries", European Journal of Operational Research, vol. 137, Issue 3, Mar. 16, 2002, pp. 483-496.
Kobielus, "The Forrester Wave: Predictive Analytics and Data Mining Solutions, Q1 2010", Forrester Research Inc. Report 4, 2010, 22 pages.
Wang et al., "On Integrated Visual Optimization System for Large Reflector Antenna Structures", Antennas Propagation and EM Theory (ISAPE), 2010 9th International Symposium on IEEE, 2010, pp. 136-139.

* cited by examiner

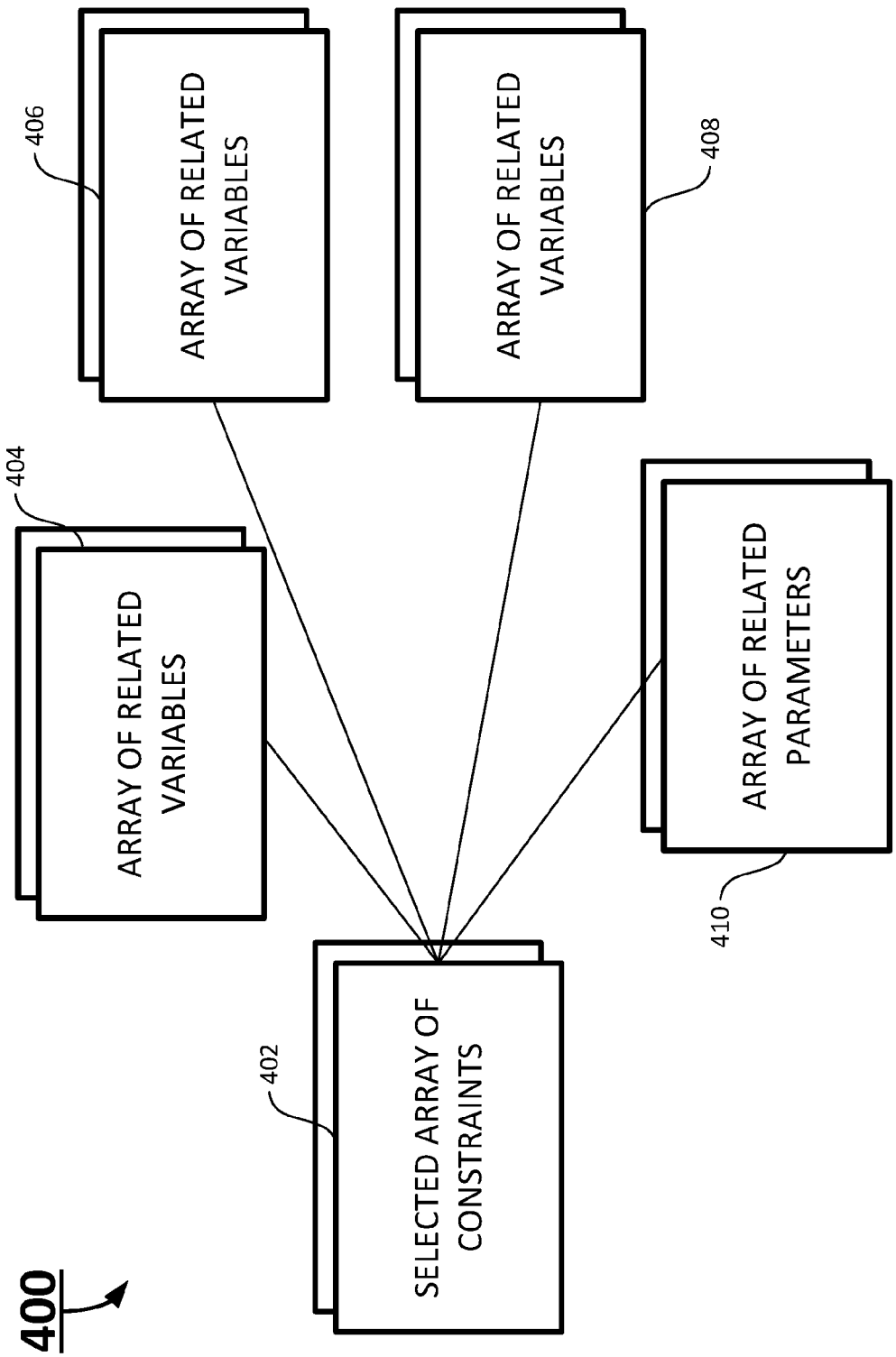

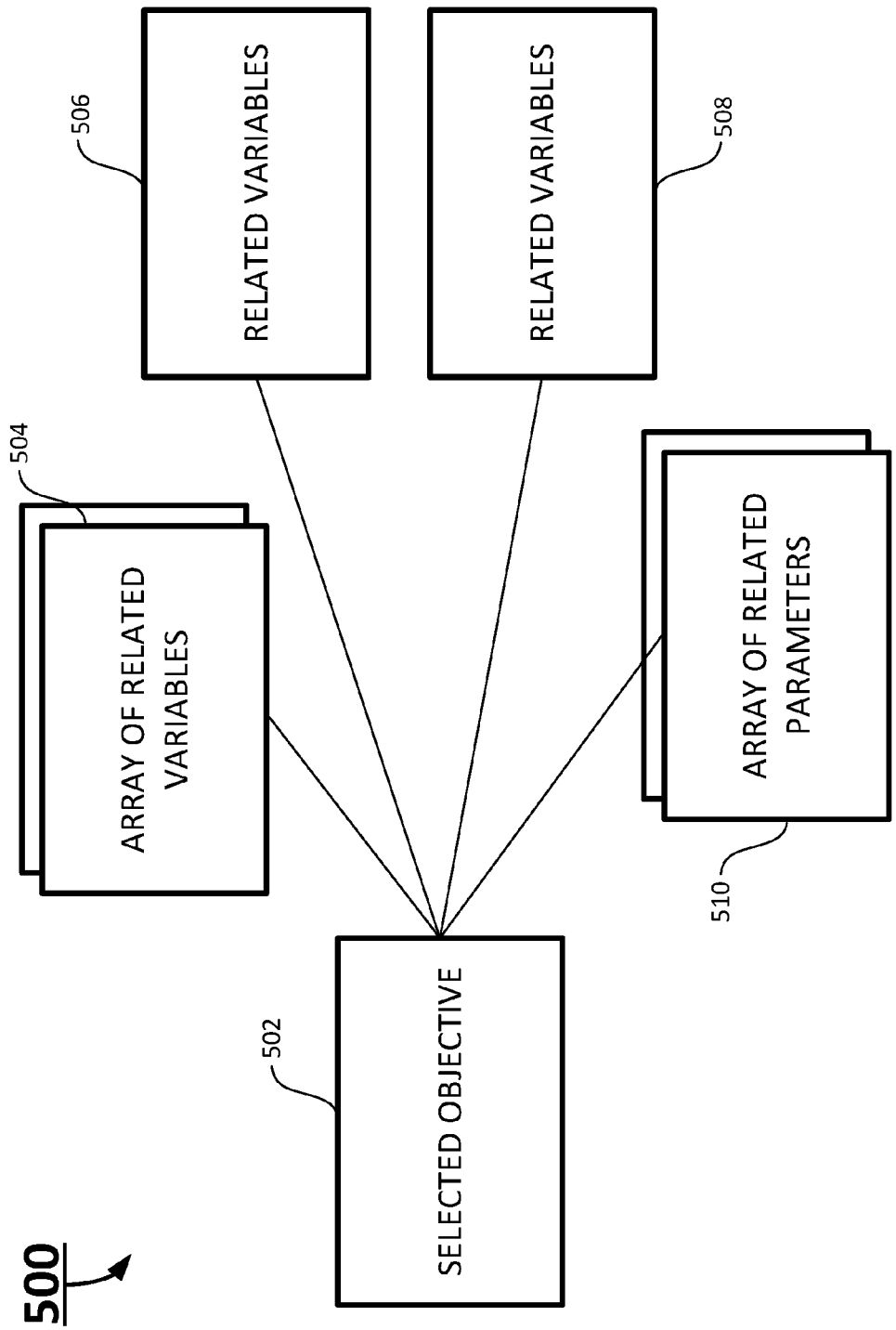

VISUAL MODELLER FOR MATHEMATICAL OPTIMIZATION

BACKGROUND

The present disclosure relates generally to computer software, and more particularly to methods and systems for visual modelling of mathematical optimization.

Mathematical optimization models have been studied and used in different industries for many years. One of the limitations to the adoption of this technique is the modelling step. Developing, understanding, and using these models traditionally require skilled mathematicians to translate industrial problems into mathematical formulations. It is desirable to have a visual modeler for mathematical optimization that is easy to understand, easy to use, and does not require involvement of skilled mathematicians so that more people are able to model optimization problems more quickly, and conveniently.

Therefore, heretofore unaddressed needs still exist in the art to address the aforementioned deficiencies and inadequacies.

SUMMARY

In an embodiment of the present invention, a method of a visual modeler of mathematical optimization may include: analyzing requirements of a visual model of mathematical optimization, designing the visual model of mathematical optimization in graphical form using a visual interface, generating code for the mathematical optimization model, and providing output/solution of the visual model of the mathematical optimization from a relevant solver. In certain embodiments, the designing may include: collecting required data in graphical form using the visual interface and collecting required data from databases connected to the visual interface, designing objects manually using simple mathematical notation by an expert user, using descriptions in words for later implementation by an inexperienced user, and selecting from a list of standard object types. The providing may include providing output computer code in a predetermined language to one or more computers to generate results of visual model of mathematical optimization, and linking visual model of mathematical optimization directly to one or more solvers to generate results for the mathematical optimization model.

In another embodiment of the present invention, a computer system of a visual modeler of mathematical optimization may include at least one computer having at least one processor, and a memory. The memory stores computer executable instructions for the visual modeler of mathematical optimization. When the computer executable instructions are executed at the processor of the computer, the computer executable instructions cause the processor to: analyze requirements of a visual model of mathematical optimization that may have entered by a user, design the visual model of mathematical optimization in graphical form using a visual interface, visualize the visual model of mathematical optimization, and provide output of the visual model of the mathematical optimization. In certain embodiments, the computer executable instructions may also cause the processor to: collect required data in graphical form using the visual interface and collect required data from databases connected to the visual interface, design objects manually using simple mathematical notation by an expert user, using descriptions in words for later implementation by an inexperienced user, and selecting from a list of standard object types. The computer executable instructions may also cause the processor to: provide output computer code in a predetermined language to one or more computers to generate results of visual model of mathematical optimization, and link visual model of mathematical optimization directly to one or more solvers to generate results of visual model of mathematical optimization.

In yet another embodiment of the present invention, the present disclosure relates to a non-transitory computer storage medium. In certain embodiments, the non-transitory computer storage medium stores computer executable instructions. When these computer executable instructions are executed by a processor of a computer, these instructions cause the processor to analyze requirements of a visual model of mathematical optimization, design the visual model of mathematical optimization in graphical form using a visual interface, visualize the visual model of mathematical optimization, and provide output of the visual model of the mathematical optimization. In certain embodiments, the computer executable instructions may also cause the processor to: collect required data in graphical form using the visual interface and collecting required data from databases connected to the visual interface, design objects manually using simple mathematical notation by an expert user, using descriptions in words for later implementation by an inexperienced user, and selecting from a list of standard object types. The computer executable instructions may also cause the processor to: provide output computer code in a predetermined language to one or more computers to generate results of visual model of mathematical optimization, and link visual model of mathematical optimization directly to one or more solvers to generate results of visual model of mathematical optimization.

These and other aspects of the present disclosure will become apparent from the following description of the preferred embodiment taken in conjunction with the following drawings and their captions, although variations and modifications therein may be affected without departing from the spirit and scope of the novel concepts of the disclosure.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

FIG. 4 shows an array of selected constraints and model objects such as variables and parameters connected to those constraints according to certain embodiments of the present invention; and FIG. 5 shows a selected objective connected to variables and parameters according to certain embodiments of the present invention.

DETAILED DESCRIPTION

Figure 1:
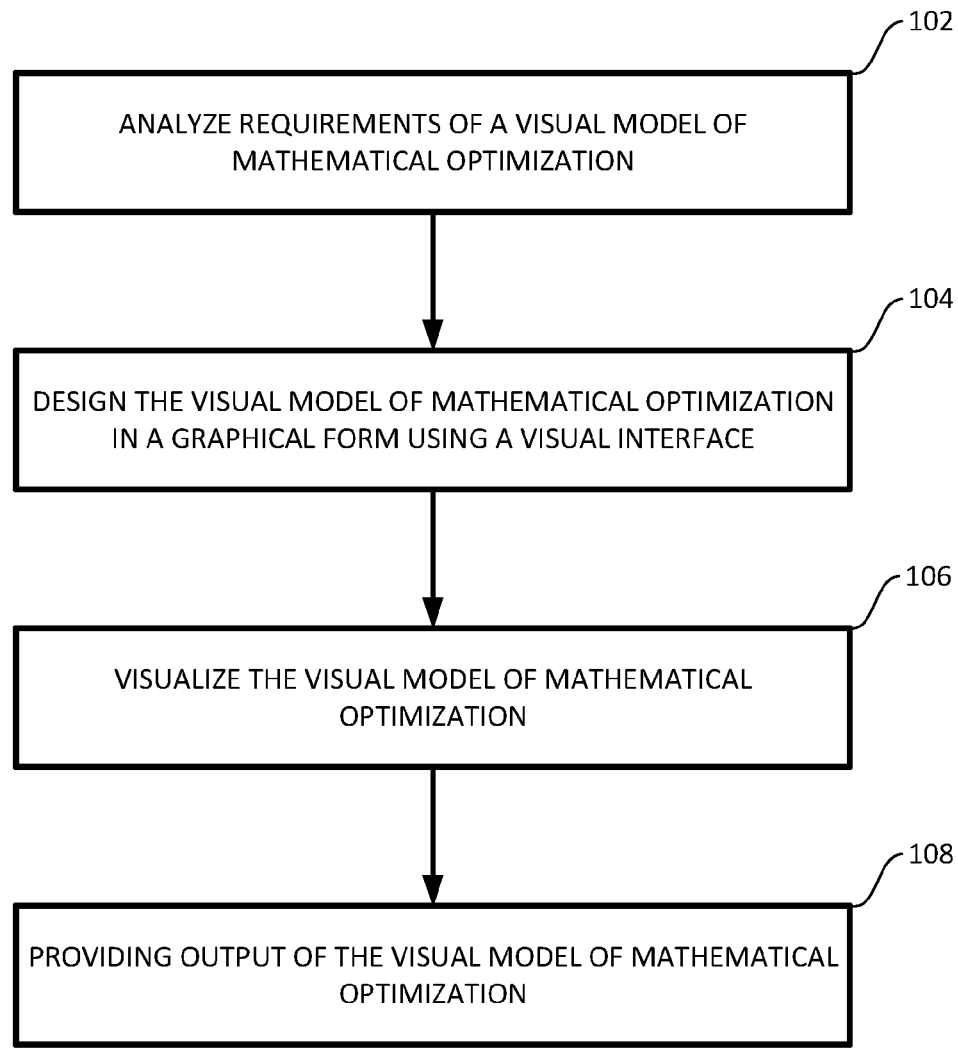
FIG. 1 is a flow chart of an exemplary method of a visual modeler of mathematical optimization according to an embodiment of the present invention.

The present disclosure is more particularly described in the following examples that are intended as illustrative only since numerous modifications and variations therein will be apparent to those skilled in the art. Various embodiments of the disclosure are now described in detail. Referring to the drawings, like numbers, if any, indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present disclosure. Additionally, some terms used in this specification are more specifically defined below.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. It will be appreciated that the same thing can be said in more than one way. Consequently, alternative language and synonyms may be used for any one or more of the terms discussed herein, nor is any special significance to be placed upon whether or not a term is elaborated or discussed herein. The use of examples anywhere in this specification including examples of any terms discussed herein is illustrative only, and in no way limits the scope and meaning of the disclosure or of any exemplified term. Likewise, the disclosure is not limited to various embodiments given in this specification.

Unless otherwise defined, all technical and scientific terms used herein have the same meaning as commonly understood by one of ordinary skill in the art to which this disclosure pertains. In the case of conflict, the present document, including definitions will control.

As used herein, "plurality" means two or more. The terms "comprising," "including," "carrying," "having," "containing," "involving," and the like are to be understood to be open-ended, i.e., to mean including but not limited to.

The term computer program, as used above, may include software, firmware, and/or microcode, and may refer to programs, routines, functions, classes, and/or objects. The term shared, as used above, means that some or all code from multiple modules may be executed using a single (shared) processor.

"R" is a free software environment for statistical computing and graphics.

"MATLAB" is a high-level language and interactive environment.

"COIN-OR" stands for COmputational INfrastructure for Operations Research.

"ILOG-CPLEX" is a High-performance mathematical programming solver for linear programming, mixed integer programming, and quadratic programming.

"GUROBI Optimizer" is a state-of-the-art mathematical programming solver.

"FICO XPRESS" is a premier mathematical modelling and optimization solution.

"GAMS" stands for General Algebraic Modelling System, and is a high-level modelling system for mathematical programming and optimization.

"OPL" stands for Optimization Programming Language.

"Mosel" is a modelling and solving environment which integrates modelling, solving, and programming facilities and implements models and solution algorithms in a single environment and in open and modular architecture.

The apparatuses and methods described herein may be implemented by one or more computer programs executed by one or more processors. The computer programs include processor-executable instructions that are stored on a non-transitory tangible computer readable medium. The computer programs may also include stored data. Non-limiting examples of the non-transitory tangible computer readable medium are nonvolatile memory, magnetic storage, and optical storage.

The present disclosure will now be described more fully hereinafter with reference to the accompanying drawings FIGS. 1-5, in which certain exemplary embodiments of the present disclosure are shown. The present disclosure may, however, be embodied in many different forms and should not be construed as limited to the embodiments set forth herein; rather, these embodiments are provided so that this disclosure will be thorough and complete, and will fully convey the scope of the disclosure to those skilled in the art.

Mathematical optimization models have been studied and used in different industries for many years. One of the limitations to the adoption of this technique is the modelling step. Developing, understanding, and using these models traditionally require skilled mathematicians to translate industrial problems into mathematical formulations.

The visual modeler of mathematical optimization draws upon some of the techniques used within software design to ease the modelling process. This means that more people are able to model optimization problems more quickly, resulting in better solutions to many business problems. Therefore, a visual modeler of mathematical optimization can be generally built in three phases: (a) analyzing requirements of the visual modeler of mathematical optimization, (b) designing the visual modeler of mathematical optimization to meet these requirements, and (c) implementing the whole code of the visual modeler of mathematical optimization in a predetermined computer language. The implementation phase makes use of automatically generated code in the predetermined computer language from the design phase. The design phase is not limited to a specific programming language and can generate starter code in the predetermined language.

There is a wide variety of optimization solvers which are available for different types of problems. These optimization solvers include functions implemented in languages such as R and Matlab, open source solvers, such as the extensive collection which can be found in the COIN-OR suite, through to commercial solvers such as IBM ILOG CPLEX, GUROBI, and FICO XPRESS. There are solvers which apply to a wide variety of specific problem types—deterministic or stochastic, linear or nonlinear, convex or non-convex, continuous or discrete, etc. These solvers can also use exact and/or heuristic methods.

There have also been efforts within the optimization community to develop modelling languages. These modelling languages allow easy access to solvers and also allow for models to be portable across different specific solvers. Some of the common modelling languages include GAMS, OPL and Mosel. There are also a number of standard formats from which problem instances can be loaded in to solvers.

It is desirable to have software or visual language which allows the user to model optimization problems in a visual manner. Such a visual modeler for mathematical optimization allows the user to model visually and then for the model to be output to a variety of languages. The visual modeler for mathematical optimization should not be limited to mixed integer programming, and could provide a clear interface to any other mathematical optimization problem for which a suitable solver was available.

Referring now to FIG. 1, a flow chart of an exemplary method 100 of a computer system for visual modelling of mathematical optimization is shown according to certain exemplary embodiments of the present disclosure.

Figure 2:
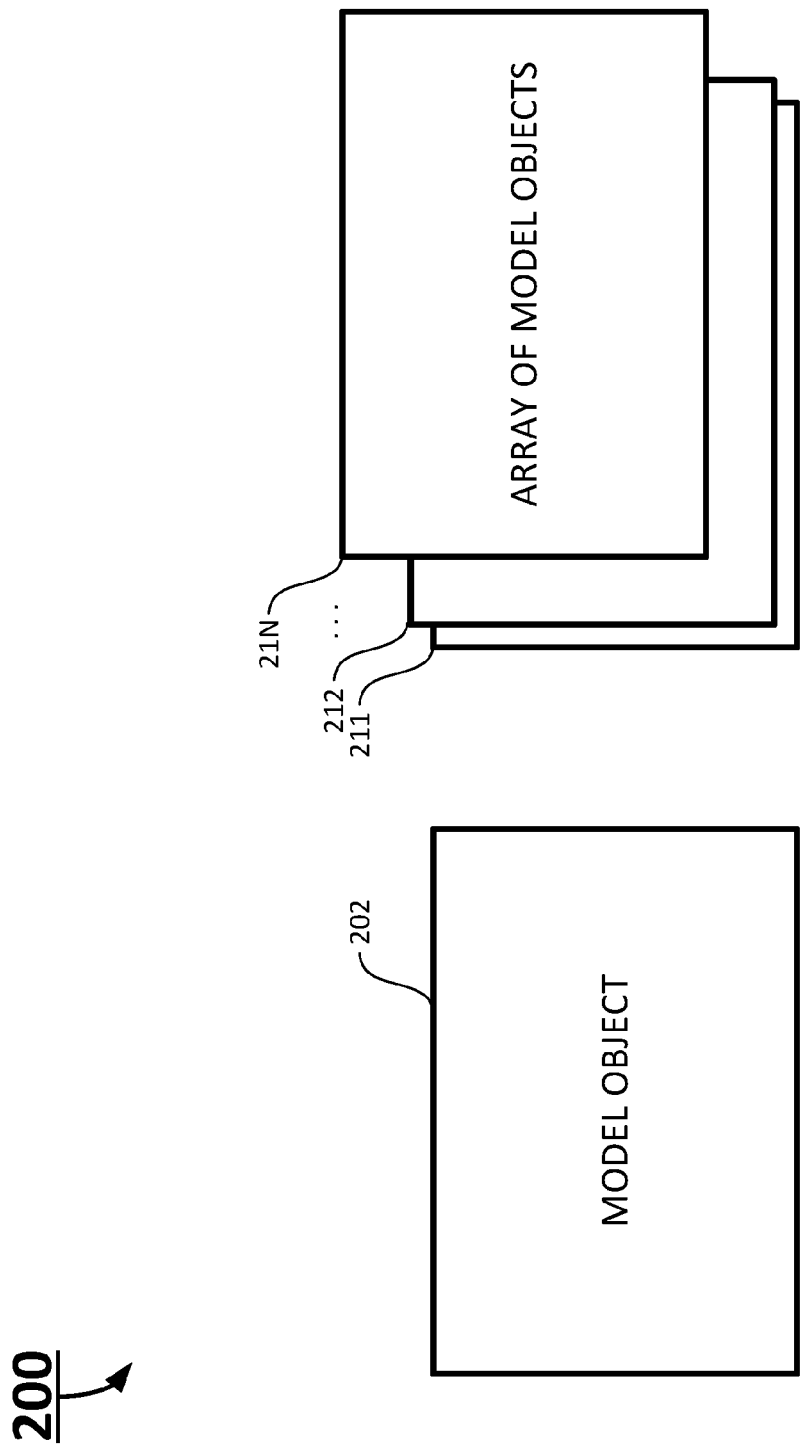
FIG. 2 shows objects in the visual model of mathematical optimization according to an embodiment of the present invention.

At block 102, a user may use the computer system to enter the requirement of a visual model of mathematical optimization, analyze the requirements and then gather all required data. All objects in the visual model 200 are represented as boxes, as shown in FIG. 2. A single object is represented in box 202. A group of objects is represented by an array of boxes, 211, 212 . . . 21n, where n=1, 2, . . . , and N, and N is a positive integer.

Figure 3:
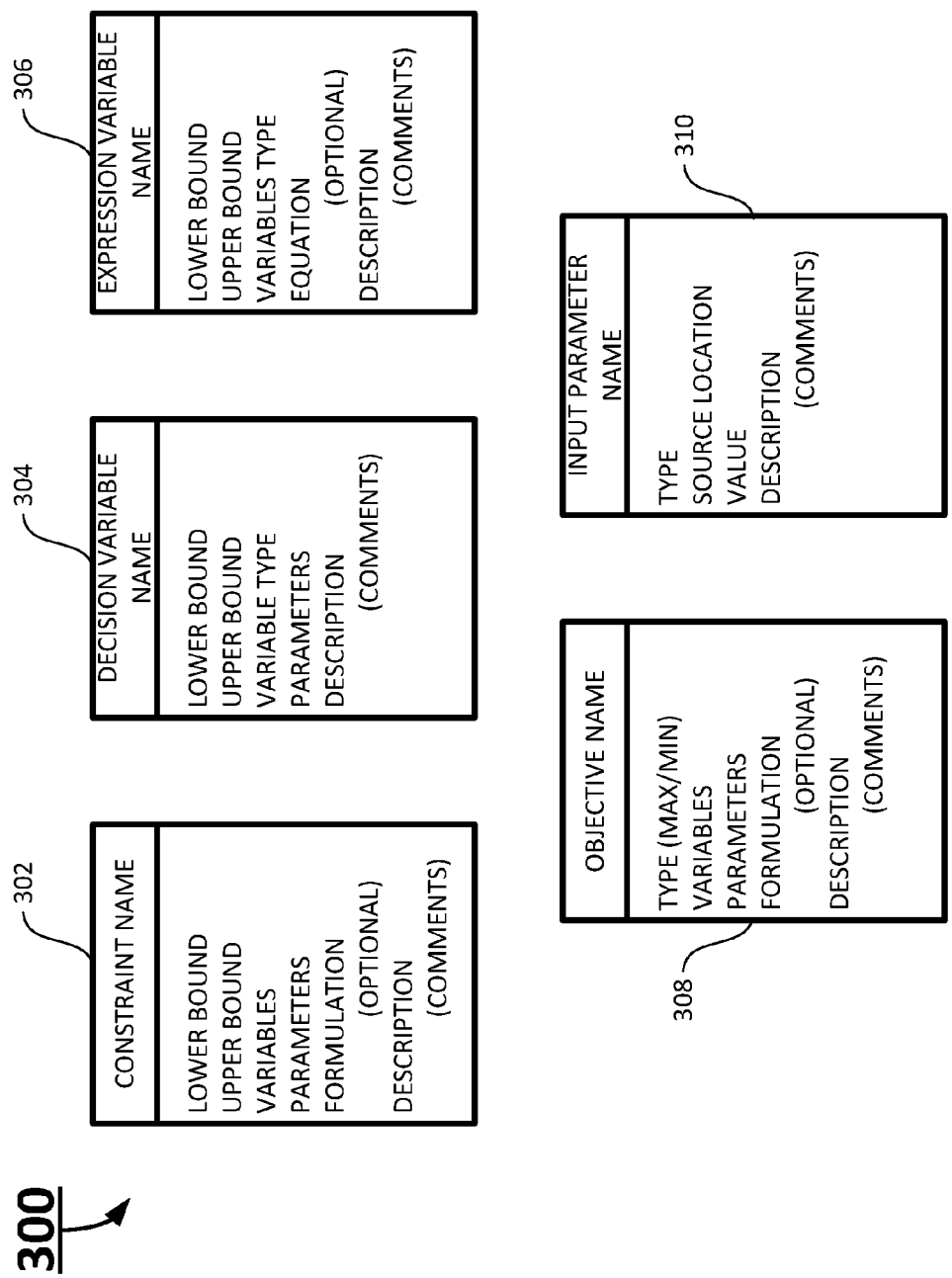
FIG. 3 illustrates an exemplary set of descriptive information required for each object type according to certain embodiments of the present invention.

In certain embodiments, usually there may be five types of objects. These five types of objects are: (1) input parameters 310, (2) decision variables 304 (binary, continuous), (3) expression variables 306, (4) objectives 308, and (5) constraints 302. Each of the five types of objects may have different properties. FIG. 3 illustrates the properties of these five different types of objects in the visual model 300 of mathematical optimization. In certain embodiments, each of the input parameters may include an input parameter name, an input parameter type, a source location, an input parameter value, and a description. Each of the decision variables may have a decision variable name, a lower bound, an upper bound, a decision variable type, one or more parameters, and a description. Each of the expression variables may have an expression variable name, a lower bound, an upper bound, an expression variable type, and a description. Optionally, the expression variable may have an equation. Each of the objectives may have an objective name, an objective type (e.g. max or min), one or more objective variables, one or more objective parameters, and a description. Optionally, the objective may have a formulation. Each of the constraints may have a constraint name, a lower bound, an upper bound, one or more constraint variables, one or more constraint parameters, and a description. Optionally, the constraint may have a formulation.

For input parameters, the user can define a name for each input parameter and its input parameter type such as integer, string, tuple, etc. The values of input parameters can be extracted from an external database. Each parameter, or set of parameters, can either be specified by value or by location within a database. Decision variables may need to be defined over a specific set of the input parameters. Each decision variable also has other information, such as its upper and lower bounds, which can be set using input parameters.

Expression variables are functions of variables which can be defined in a similar manner to constraints. Like constraints, the objective is a function of the variables, with attached information describing whether it is a maximization or a minimization objective. This can be described using any of the methods for describing constraints—standard forms, comments for future implementation, or mathematical notation. It is possible for the user to define multiple objectives. The user can then select one of these, or can define a multi-objective problem, with the system guiding them in order to choose rankings and priorities for the objectives.

Connections can be made between model objects of certain types, such as constraints and variables. To view these connections in detail, it is possible to select, for example, a set of constraints. This will then highlight all of the other model objects which are linked to those constraints. FIG. 4 shows a visual model 400 that includes an array of selected constraints and model objects connected to those constraints. A selected array of constraints 402 may be related to or be linked to several separate arrays of related variables 404, 406, and 408, and an array of related parameters 410. To look in more detail, the user can also select a single object within an array and look at the objects which are linked to that particular object. FIG. 5 shows a visual model 500 that includes a selected constraint and model objects connected to the selected constraint. A selected constraint 502 may be related to or be linked to an array of related variables 504, two separate related variables 506 and 508, and an array of related parameters 510.

When modelling optimization problems which are naturally set on networks, the visual model of mathematical optimization system will intuitively allow the user to input and store all of their data in a graphical form. This will make it easier both to build models and to visualize solutions. Using the visual model of mathematical optimization system, standard problem types such as vehicle routing problems, facility location problems, set covering, etc. can be made available as templates with short descriptions. These templates can include suggested data and constraint types with flexibility of modifications by user if required. If a solution is available, then the information about that solution can be added in to each of the model objects for detailed exploration.

At block 104, a user may use the computer system to design the visual model of mathematical optimization in graphical form using a visual interface. In certain embodiments, the user may collect various data in graphical form using the visual interface. The user may collect various data from various databases connected to the visual interface. For example, the user may collect certain input parameter from the source location of input parameters indicated by the properties of the input parameter. The source location of the input parameters may be a table, a database, or another input parameter.

There are several different ways for a user to design the visual model of mathematical optimization. One of the more complicated aspects of optimization modelling is handling constraints. The visual model of mathematical optimization seeks to allow users the freedom to visualize the problem without understanding the mathematical model in detail. For this reason, constraints can be handled in at least three different manners. In one embodiment, an expert user may use simple mathematical notation to design the visual model of mathematical optimization. In another embodiment, an inexperienced user may enter certain descriptions in words in the object property, and the visual model of mathematical optimization may be implemented based on the descriptions later. In yet another embodiment, a user may select objects from a list of standard object types and drag and drop in the graphical form. It allows the user to fill in certain gaps with links to the relevant data, parameters, and variables.

At block 106, the visual model of mathematical optimization can visualize the designed visual model of mathematical optimization in different ways. For example, the user may visualize native views of the solution through the visual interface. The user may also visualize views of the solutions through one or more graphing and charting tools connected to the visual interface.

At block 108, the visual model of mathematical optimization may provide the output results or solutions in different ways. The visual model can automatically generate codes according to the design and requirements and find solutions through the relevant mathematical optimization solvers. The user has the option to select a subset of objective function(s) and constraint(s) in order to solve the problem using only those. If the visual model of mathematical optimization system is connected to an underlying optimization engine and all constraints, expression variables, and objective function(s) have been fully expressed (either as standard forms or via the users own knowledge), then the optimization problem can be solved directly using automatically generated code. The user can interact visually with the results of optimization model.

For example, in one embodiment, the output result is computer executable code in a predetermined computer language to one or more computers to generate the results of the visual model of mathematical optimization. If some aspects still need to be implemented, or if the user desires more manual control, then the visual model of mathematical optimization can output code to the desired language such as Java, C++, C#, C, Visual Basic, Python, OPL, etc.

In another embodiment, the output of the visual model of mathematical optimization may be directly linked to one or more solvers to generate the results of the visual model of the mathematical optimization from the solvers. There are multiple solvers depending on the model such as linear programming (LP) solver, quadratic programming (QP) solver, non-linear programming (NLP) solver, Mixed-Integer Programming (MIP) solver, quadratic constraints programming (QCP) solver, mixed integer quadratic programming (MIQP) solver, mixed-integer non-linear programming (MINLP) solver, and mixed integer quadratically constrainted programming (MIQCP) solver, etc.

Whether the visual model of the mathematical optimization is used to directly solve the problem, or to output initial code, the visual model of the mathematical optimization contains a representation of the problem data and decision variables. This representation can be used to display the final solution(s). All of the information about each variable and constraint can be attached to its object. The result can also be shown visually depending on the nature of the solutions. For example, for scheduling we can set the results to be shown in the Gantt charts.

In certain embodiments, the solvers can solve some standard optimization modelling types in an efficient ways but not all cases. For a complex optimization model, some algorithms including heuristics and metaheuristics should be used in order to find suitable solutions. In the design phase the output computer code may be modified according to what is required to solve the model and embed some of the predefined metaheuristic algorithms.

In another embodiment of the present invention, a computer system of a visual modeler of mathematical optimization may include at least one computer having at least one processor, and a memory. The memory stores computer executable instructions for the visual modeler of mathematical optimization. When the computer executable instructions are executed at the processor of the computer, the computer executable instructions cause the processor to: analyze requirements of a visual model of mathematical optimization, design the visual model of mathematical optimization in graphical form using a visual interface, visualize the visual model of mathematical optimization, and provide output of the visual model of the mathematical optimization. In certain embodiments, the computer executable instructions may also cause the processor to: collect required data in graphical form using the visual interface and collecting required data from databases connected to the visual interface, design objects manually using simple mathematical notation by an expert user, using descriptions in words for later implementation by an inexperienced user, and selecting from a list of standard object types. The computer executable instructions may also cause the processor to: provide output computer code in a predetermined language to one or more computers to generate results of visual model of mathematical optimization, and link visual model of mathematical optimization directly to one or more solvers to generate results of visual model of mathematical optimization.

In yet another embodiment of the present invention, the present disclosure relates to a non-transitory computer storage medium. In certain embodiments, the non-transitory computer storage medium stores computer executable instructions. When these computer executable instructions are executed by a processor of a computer, these instructions cause the processor to analyze requirements of a visual model of mathematical optimization, design the visual model of mathematical optimization in graphical form using a visual interface, visualize the visual model of mathematical optimization, and provide output of the visual model of the mathematical optimization. In certain embodiments, the computer executable instructions may also cause the processor to: collect required data in graphical form using the visual interface and collecting required data from databases connected to the visual interface, design objects manually using simple mathematical notation by an expert user, using descriptions in words for later implementation by an inexperienced user, and selecting from a list of standard object types. The computer executable instructions may also cause the processor to: provide output computer code in a predetermined language to one or more computers to generate results of visual model of mathematical optimization, and link visual model of mathematical optimization directly to one or more solvers to generate results of visual model of mathematical optimization.

The present invention may be a computer system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of visual modeling of mathematical optimization comprising:
    entering and analyzing, by a user using a computer system, one or more requirements of a visual model of mathematical optimization to be modeled;
    designing, by the user, the visual model of mathematical optimization using a plurality of data collected from one or more databases in graphical form through a visual programming graphical user interface;
    generating, by the visual programming graphical user interface automatically, computer executable codes in a predetermined computer language according to the design and requirements of the mathematical optimization model; and
    providing output of the visual model of the mathematical optimization, wherein the output comprises: the computer executable codes generated, and results of the visual model of the mathematical optimization obtained from one or more optimization solvers linked with the computer executable codes generated; wherein the designing comprises:
    collecting the plurality of data in graphical form using the visual programming graphical user interface; and
    collecting the plurality of data from the plurality of databases connected to the visual programming graphical user interface.

2. The method of claim 1, wherein the designing comprises:

designing a plurality of objects manually using simple mathematical notation by a user;

designing the plurality of objects with descriptions in words for later implementation by a user; and designing the plurality of objects by selecting from a list of standard object types which allows a user to fill in a plurality of gaps with links to relevant data and variables.

3. The method of claim 2, wherein the plurality of objects comprises:

a plurality of input parameters, wherein each of the plurality of input parameters comprises an input parameter name, an input parameter type, a source location, an input parameter value, and a description;

a plurality of decision variables, wherein each of the decision variables comprises a decision variable name, a lower bound, an upper bound, a decision variable type, one or more decision parameters, and a description;

a plurality of expression variables, wherein each of the expression variables comprises an expression variable name; a lower bound, an upper bound, an expression variable type, and a description;

a plurality of objectives, wherein each of the objectives comprises an objective name, an objective type, one or more objective variables, one or more objective parameters, and a description; and a plurality of constraints, wherein each of the constraints comprising a constraint name, a lower bound, an upper bound, one or more constraint variables, one or more constraint parameters, and a description.

4. The method of claim 3, wherein the designing comprises connecting the plurality of objects of a certain type in graphical form, wherein the certain type comprise constraints, and variables.

5. The method of claim 1, wherein the providing comprises visualization from the one or more optimization solvers.

6. The method of claim 1, wherein the providing comprises:

providing results of the visual model of the mathematical optimization obtained by executing the computer executable codes generated in the predetermined language; and providing results of the visual model of the mathematical optimization obtained by executing the one or more optimization solvers linked with the computer executable codes generated.

7. A computer system comprising:

at least one computer having a processor and a memory storing computer executable instructions for a visual modeling of mathematical optimization, which, when executed at the processor of the at least one computer, are configured to:

enter and analyze, by a user using a computer system, one or more requirements of a visual model of mathematical optimization to be modeled;

design, by a user, the visual model of mathematical optimization using a plurality of data collected from one or more databases in graphical form through a visual programming graphical user interface;

generate, by the visual programming graphical user interface automatically, computer executable codes in a predetermined computer language according to the design and requirements of the mathematical optimization model; and provide output of the visual model of the mathematical optimization, wherein the output comprises: the computer executable codes generated, and results of the visual model of the mathematical optimization obtained from one or more optimization solvers linked with the computer executable codes generated; wherein the computer executable instructions are configured to collect the plurality of data in graphical form using the visual programming graphical user interface; and collect the plurality of data from a plurality of databases connected to the visual programming graphical user interface.

8. The computer system of claim 7, wherein the computer executable instructions are configured to:

design a plurality of objects manually using simple mathematical notation by a user;

design the plurality of objects with descriptions in words for later implementation by a user; and design the plurality of objects by selecting from a list of standard object types which allows a user to fill in a plurality of gaps with links to relevant data and variables.

9. The computer system of claim 8, wherein the plurality of objects comprises:

a plurality of input parameters, wherein each of the plurality of input parameters comprises an input parameter name, an input parameter type, a source location, an input parameter value, and a description;

a plurality of decision variables, wherein each of the decision variables comprises a decision variable name, a lower bound, an upper bound, a decision variable type, one or more decision parameters, and a description;

a plurality of expression variables, wherein each of the expression variables comprises an expression variable name; a lower bound, an upper bound, an expression variable type, and a description;

a plurality of objectives, wherein each of the objectives comprises an objective name, an objective type, one or more objective variables, one or more objective parameters, and a description; and a plurality of constraints, wherein each of the constraints comprising a constraint name, a lower bound, an upper bound, one or more constraint variables, one or more constraint parameters, and a description.

10. The computer system of claim 9, wherein the computer executable instructions are configured to connect the plurality of objects of a certain type in graphical form, wherein the certain type comprise constraints, and variables.

11. The computer system of claim 7, wherein the computer executable instructions are configured to present visualization from the one or more optimization solvers.

12. The computer system of claim 7, wherein the computer executable instructions is configured to:

provide results of the visual model of the mathematical optimization obtained by executing the computer executable codes generated in the predetermined language; and provide results of the visual model of the mathematical optimization obtained by executing the one or more optimization solvers linked with the computer executable codes generated.

13. A non-transitory computer storage medium having computer executable instructions stored thereon which, when executed by a processor of a computer, cause the processor to:

enter and analyze, by a user using a computer system, one or more requirements of a visual model of mathematical optimization to be modeled;

design, by a user, the visual model of mathematical optimization using a plurality of data collected from one or more databases in graphical form through a visual programming graphical user interface;

generate, by the visual programming graphical user interface automatically, computer executable codes in a predetermined computer language according to the design and requirements of the mathematical optimization model; and provide output of the visual model of the mathematical optimization, wherein the output comprises: the computer executable codes generated, and results of the visual model of the mathematical optimization obtained from one or more optimization solvers linked with the computer executable codes generated; wherein the computer executable instructions are configured to:

collect the plurality of data in graphical form using the visual programming graphical user interface; and collect the plurality of data from a plurality of databases connected to the visual programming graphical user interface.

14. The non-transitory computer storage medium of claim 13, wherein the computer executable instructions are configured to:

design a plurality of objects manually using simple mathematical notation by a user;

design the plurality of objects with descriptions in words for later implementation by a user; and design the plurality of objects by selecting from a list of standard object types which allows a user to fill in a plurality of gaps with links to relevant data and variables.

15. The non-transitory computer storage medium of claim 14, wherein the plurality of objects comprises:

a plurality of input parameters, wherein each of the plurality of input parameters comprises an input parameter name, an input parameter type, a source location, an input parameter value, and a description;

a plurality of decision variables, wherein each of the decision variables comprises a decision variable name, a lower bound, an upper bound, a decision variable type, one or more decision parameters, and a description;

a plurality of expression variables, wherein each of the expression variables comprises an expression variable name; a lower bound, an upper bound, an expression variable type, and a description;

a plurality of objectives, wherein each of the objectives comprises an objective name, an objective type, one or more objective variables, one or more objective parameters, and a description; and a plurality of constraints, wherein each of the constraints comprising a constraint name, a lower bound, an upper bound, one or more constraint variables, one or more constraint parameters, and a description.

16. The non-transitory computer storage medium of claim 13, wherein the computer executable instructions are configured to present visualization from the one or more optimization solvers.

17. The non-transitory computer storage medium of claim 13, wherein the computer executable instructions is configured to provide results of the visual model of the mathematical optimization obtained by executing the computer executable codes generated in the predetermined language; and provide results of the visual model of the mathematical optimization obtained by executing the one or more optimization solvers linked with the computer executable codes generated.

* * * * *